April 3, 1956 W. W. BOWSER 2,740,891

OSCILLATOR

Filed Feb. 5, 1952 2 Sheets-Sheet 1

INVENTOR.
Willard Wayne Bowser

BY
Foorman L. Mueller
Atty.

INVENTOR.
Willard Wayne Bowser
BY Norman L. Mueller
Atty.

United States Patent Office 2,740,891

Patented Apr. 3, 1956

2,740,891

OSCILLATOR

Willard Wayne Bowser, Geneva, Ill., assignor to Motorola, Inc., Chicago, Ill., a corporation of Illinois Application February 5, 1952, Serial No. 270,081

13 Claims. (Cl. 250—36)

This invention relates generally to crystal controlled oscillators, and more particularly to two-stage crystal oscillator circuits in which feedback is provided through a cathode follower stage.

Crystal controlled oscillators have been used in many applications wherein very accurate control of frequency is required. Crystals have been found to have very high Q and thereby provide greater accuracy than can be obtained by frequency controlling means such as tuned circuits. However, in many applications it is desired to shift the oscillator frequency while still maintaining steady control. Such a shift in frequency is generally referred to as a warp of the crystal frequency. Because of the very high Q of the crystal it has been difficult to provide oscillator circuits which are crystal controlled and in which the oscillator frequency can be shifted while at the same time maintaining stable operation.

In providing large scale production of equipment including crystal controlled oscillators, it is highly desirable for several reasons that the oscillator frequency can be adjusted with respect to the natural crystal frequency. First, in order to provide relatively inexpensive crystals, the crystals received from production will not have exactly the same frequency, but will vary somewhat due to manufacturing tolerances. It is therefore desired to compensate for the variances of the crystal structure itself. Further, when used in a superheterodyne receiver, the tuning of the intermediate frequency amplifier and/or the discriminator may be slightly off frequency, and it may be desirable therefore to change or warp the oscillator frequency slightly so that the received signal will correspond to the center frequency of the intermediate frequency amplifier and discriminator. To compensate for mistuning of such components in this way may be more easily accomplished than to provide correct tuning of the components themselves. There are many other instances in which it is desired to change the frequency of a crystal controlled oscillator, such as to provide automatic frequency control in a system using the crystal oscillator.

It is therefore an object of the present invention to provide an improved oscillator having crystal control, which may be operated over a relatively wide band of frequencies and at the same time provide highly stable operation and adequate output.

A further object of this invention is to provide an improved crystal oscillator circuit which may be adjusted in frequency with respect to the natural crystal frequency to compensate for tolerances in crystal manufacture and/or to compensate for mistuning of circuits associated with the oscillator.

Another object of the invention is to provide a crystal controlled oscillator which may be tuned for operation over a relatively wide range of frequencies and which range may be selected within certain limits.

A feature of this invention is the provision of a crystal controlled oscillator, operating near the crystal series mode, in which feedback is provided through a cathode follower stage capacitively coupled to a first stage controlled by the crystal.

A further feature of this invention is the provision of an oscillator including a first stage having the crystal in the grid circuit thereof, a tuned plate circuit for adjusting the frequency of the oscillator, and a feedback circuit including a cathode follower stage having the input coupled through a condenser to the plate of the first stage and the output coupled through a second condenser to the cathode of the first stage, with the value of the two condensers and the value of the cathode resistors of the two stages adjusted to provide feedback in the proper phase relationship for sustaining oscillations over a relatively wide frequency range.

Another feature of this invention is the provision of a crystal controlled oscillator tunable through a wide range including an inductor connected in series with the crystal in the grid circuit of a tube, with the plate thereof adjustably tuned, and feedback provided through a cathode follower stage. By properly selecting the series inductor and the feedback circuit range over which the oscillator is adjustable can be determined.

Further objects, features, and the attending advantages of the invention will be apparent from a consideration of the following description when taken in connection with the accompanying drawings, in which.

Figures 1, 2, 3, 4, 8, 9:
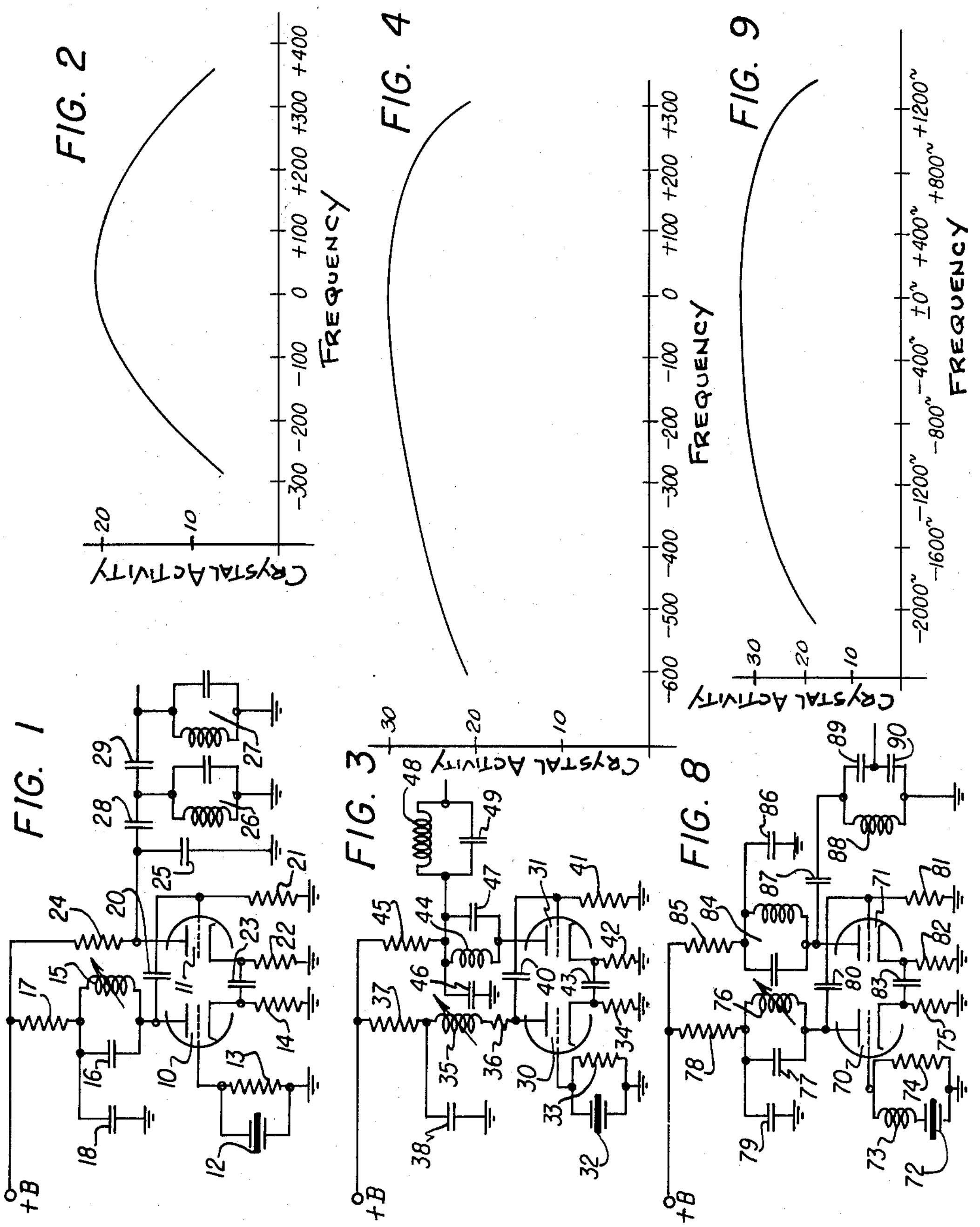
Fig. 1 is a circuit diagram of an oscillator in accordance with the invention adapted for use in a superheterodyne receiver circuit.
Fig. 2 is a curve illustrating the activity of the oscillator for a range of frequencies extending on each side of the maximum activity point.
Fig. 3 illustrates an oscillator in accordance with the invention designed for use in a transmitter.
Fig. 4 illustrates the activity of the oscillator of Fig. 3 for a range of frequencies extending on each side of the maximum activity point.
Figure 7:
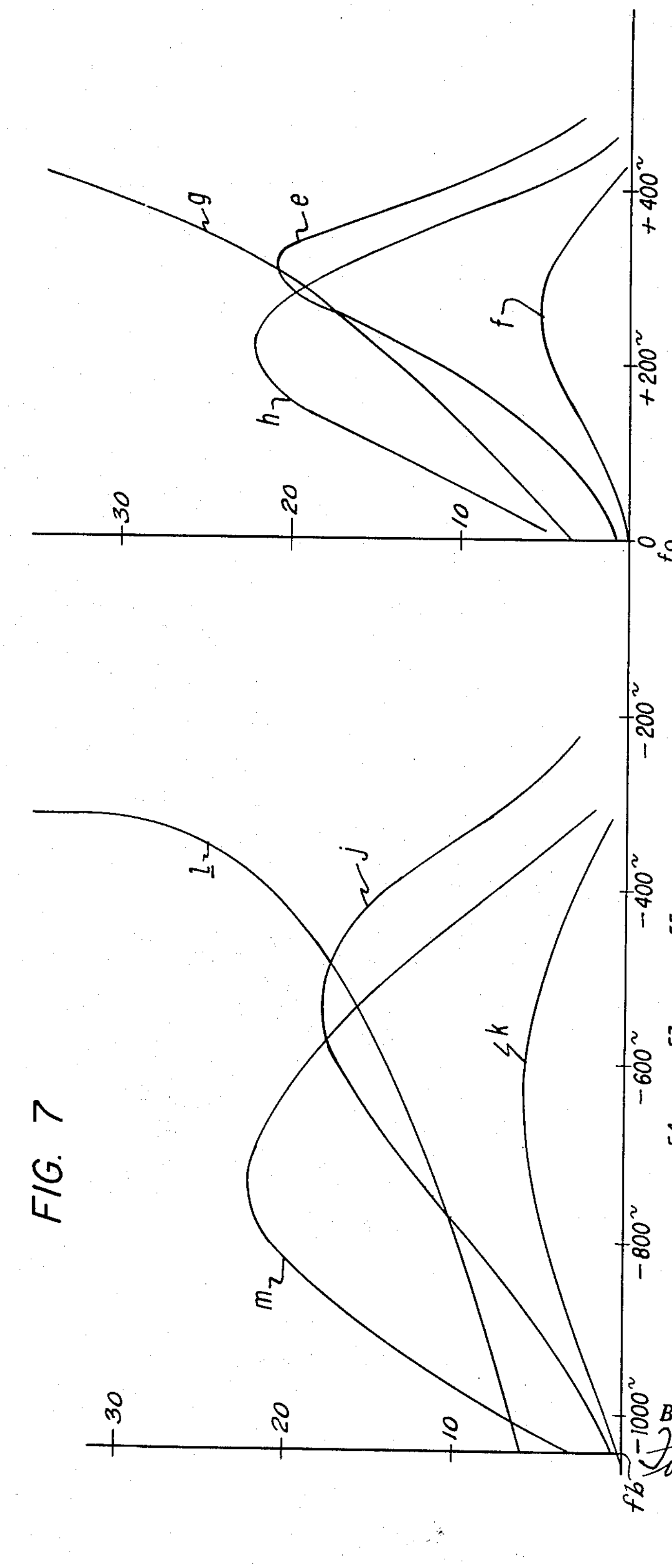
Figure 5:
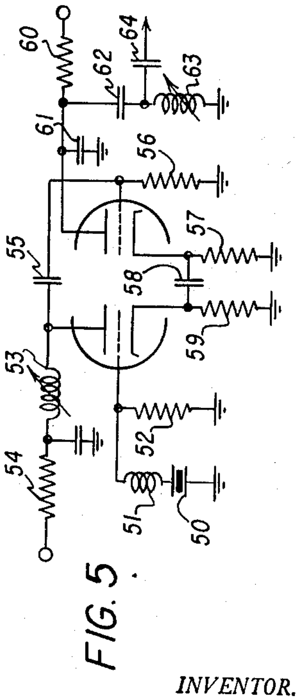
Fig. 5 illustrates the circuit of another embodiment of the invention.

Fig. 7 includes curves illustrating the operation of the circuit of Fig. 5;

Fig. 8 is a circuit diagram of a still further embodiment; and

Fig. 9 illustrates the characteristics of the oscillator of Fig. 8.

In practicing the invention there is provided a crystal controlled oscillator including a first stage having an electron discharge valve including a cathode, an anode and a control grid, with a crystal and a first resistor connected in parallel between the grid and ground. A second resistor is connected between the cathode and ground, and a tuned circuit is connected between the anode and a source of positive potential. The tuning of this circuit is adjusted to frequencies above the series resonant frequency of the crystal in the inductive reactance region of the crystal. This may be above the series resonant point for the fundamental frequency or an overtone such as the third or fifth overtone. The resistor bridging the crystal has such a value that self oscillations in the stage are prevented and also so that the stage will not operate as a crystal tuned grid, tuned plate oscillator. That is, the bridging resistors permits oscillation only near the series mode of the crystal.

Feedback for the oscillator is provided through a cathode follower stage which may be a triode having the grid thereof connected through a capacitor to the plate of the first stage and the cathode thereof connected through a second condenser to the cathode of the second stage. The condenser coupling between the cathodes of the two stages permits the use of separate resistors in each cathode so that each may be operated to provide optimum characteristics. By properly selecting the values of the two condensers in the feedback path and the cathode resistors of the two stages, the proper phase relationship can be provided for sustaining feedback over a relatively wide warp range, with the frequency of operation being determined by the tuning of the anode circuit of the first stage. It has been found that the cathode resistor of the cathode follower stage should be at least twice as large as the cathode resistor of the first stage and that the condenser connecting the cathodes should generally be smaller than the condenser connected between the plate of the first stage and the grid of the cathode follower. Satisfactory operation has been obtained, however, when the condensers are of the same value or the condenser connected to the cathodes has a somewhat greater value, if the resistor connected to the cathode of the first stage is made quite small.

It has been found that by connecting an inductor in series with the crystal, to thereby alter the characteristic curve of the crystal so that the series resonance point is shifted to a lower frequency, the characteristic curve becomes flatter just above the series resonant frequency. This permits operation of the oscillator over a wider range of frequencies (warp) while still providing highly stable operation and adequate output.

Referring now to the drawings, in Fig. 1 there is illustrated one embodiment of the invention wherein the oscillator is formed by the double triode including the sections 10 and 11. The section 10 includes a grid, with the crystal 12 connected between the grid and ground. A resistor 13 is bridged across the crystal 12 and a second resistor 14 is connected between the cathode and ground. For tuning the oscillator there is provided a tuned circuit connected to the plate of the section 10, including a variable inductor 15 and the parallel condenser 16. The tuned circuit is connected to plus B through resistor 17, with the circuit being bypassed by condenser 18.

Feedback is provided for sustaining oscillations in the triode 10 by the circuit including the triode 11. The grid of triode 11 is connected to the plate of the triode 10 through condenser 20. Resistor 21 is connected to the grid of the triode 11 and develops the input voltage therefor. The cathode of the triode 11 is connected to ground through resistor 22. The triode 11 acts as a cathode follower, and the output from the cathode thereof is applied through condenser 23 to the cathoed of triode 10. B plus potential is applied to the anode of the triode 11 through resistor 24, with the power supply being bypassed by condenser 25. The output may be taken from the anode of the triode 11 and may be used in various ways. In the circuit shown the oscillator frequency is multiplied in the anode circuit by tuned circuits 26 and 27 which are connected to the anode by condensers 28 and 29 respectively.

As previously stated, resistor 13 is selected at a value so that the crystal 12 operates near the series mode. The tuned circuit including inductor 15 and condenser 16 is tuned above the series resonant frequency, either of the fundamental mode of the crystal or an overtone thereof. Resistor 21 must have a sufficiently high value so that the amplitude of the feedback is sufficient to provide the desired oscillator output amplitude. The values of condensers 20 and 23 and resistors 22 and 14 are selected to provide feedback of the proper phase for sustaining oscillations over a relatively wide range of frequencies.

Fig. 2 illustrates the activity characteristics of an oscillator constructed in accordance with Fig. 1. In this oscillator the tuned circuit 15, 16 is tuned to a frequency of 15.6 megacycles which is the third overtone of the crystal being used. The crystal therefore has a fundamental frequency of the order of 5 megacycles. The crystal used is of the AT type having plated electrodes on the crystal faces. The other components have the following values:

| | |
|---|---|
| Triodes **10** and **11** | Type 12AT7 (two sections). |
| Resistor **13** | 4700 ohms. |
| Resistor **14** | 180 ohms. |
| Condenser **20** | 24 micromicrofarads. |
| Resistor **21** | 100,000 ohms. |
| Resistor **22** | 820 ohms. |
| Condenser **23** | 24 micromicrofarads. |
| Plus B potential | 200 volts. |

It is therefore seen that the condensers have equal values and the resistor 22 is slightly more than four times the value of resistor 14.

Fig. 2 shows the frequency range through which stable operation of the oscillator is obtained. This shows the crystal activity, as measured by the voltage across resistor 21, with respect to frequency. As previously stated, the crystal operates in the inductive reactance region. The circuit described above operates very stably through a frequency range extending 315 cycles below the maximum activity point and 405 cycles above the maximum activity point. This provides a warp range of over 700 cycles which permits compensating for manufacturing tolerances in the crystal construction and also for mistuning of the circuits associated with the crystal. The voltage across resistor 21 was approximately 22 volts at the point of maximum activity and about 8.5 volts at the extremities of the curve of Fig. 2. The value of 8.5 volts has been found to provide sufficient oscillator output in many applications in which the oscillator is used. It was found that variations in the plus B potential between 150 and 300 volts at the maximum activity point, produced only slight changes in frequency. The frequency increased only 25 cycles at 300 volts and dropped only 10 cycles at 150 volts.

In Fig. 3 there is illustrated an oscillator in accordance with the invention which is designed for use in a frequency modulation transmitter. This oscillator also includes a double triode valve having sections 30 and 31. The crystal 32 is connected to the grid of the first stage and is bridged by resistor 33. The cathode of this stage is connected to ground through resistor 34 and the plate circuit is tuned by inductor 35. A de-coupling resistor 36 is provided between the anode and the inductor 35 and a dropping resistor 37 is connected between the inductor and the positive potential. A bypass condenser 38 is also provided for the power supply.

Feedback is provided through the second triode section 31 with the feedback circuit including condenser 40 connected between the plate of the triode 30 and the grid of the triode 31. The grid of the triode 31 is connected to ground through resistor 41 and the cathode is connected to ground through resistor 42 and is connected through condenser 43 to the cathode of the triode 30 to complete the feedback path. The output of the oscillator is taken from the plate of the cathode follower tube 31 which is connected to the modulation choke 44 and through dropping resistor 45 to plus B. Condenser 46 provides bypass for the power supply, and condenser 47 is bridged across the choke 44. Energy may be applied to the modulator through the circuit including inductor 48 and condenser 49.

The circuit of Fig. 3 has been found to provide stable operation through a very wide warp range as indicated by the curve of Fig. 4. This curve shows the crystal activity, as measured by the voltage across resistor 41, with variation in frequency. The maximum activity of the oscillator is about 31 volts (across resistor 41) and the frequency can vary 600 cycles below the maximum activity point and a little more than 300 cycles above the maximum activity point and still provide an activity of 21 volts, which is adequate for typical applications. The oscillator providing the above characteristics, operates at a frequency of 19.5 megacycles (inductor 35). The crystal is of the AT type operating at the third overtone, and the frequency is slightly above the series resonance point for this overtone. The other components of the oscillator have the following values:

| | |
|---|---|
| Triodes 30 and 31 | Tube type 12AT7. |
| Resistor 33 | 820 ohms. |
| Resistor 34 | 330 ohms. |
| Resistor 36 | 22 ohms. |
| Resistor 37 | 4700 ohms. |
| B plus | 250 volts. |
| Condenser 40 | 20 micromicrofarads. |
| Resistor 41 | 335,000 ohms. |
| Resistor 42 | 1800 ohms. |
| Condenser 43 | 3.3 micromicrofarads. |

It is seen that in this application the condenser 40 is much larger than the condenser 43, and the resistor 42 is somewhat more than five times the value of resistor 34.

Figure 6:
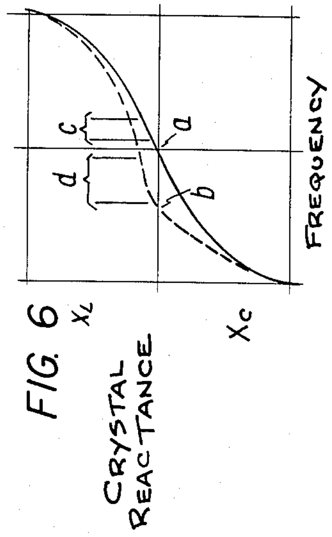
Fig. 6 illustrates the crystal characteristics utilized in the circuit of Fig. 5.

In Fig. 5 there is illustrated a circuit which is generally similar to the circuit of Fig. 1 but in this circuit an inductor is connected in series with the crystal. The provision of an inductor in series with the crystal changes the characteristic curve of the crystal in a manner generally shown in Fig. 6. In Fig. 6 the solid line illustrates the characteristic curve of the crystal alone, and the dotted curve illustrates the effective characteristic curve of the crystal with the inductor in series therewith. Fig. 6 shows the reactance of the crystal plotted against frequency, with the reactance being capacitive ($X_c$) at lower frequencies and inductive ($X_l$) at higher frequencies. It will be noted that the use of the series inductor lowers the effective series resonance frequency of the crystal, moving the same from point *a* to point *b*. This also causes the characteristic to tend to flatten for frequencies above the effective series resonant point, or in the inductive reactance region where operation takes place in the oscillator circuit in accordance with the invention. This will be noted by comparing the extent of the band *c* with that of band *d*.

The characteristics of the oscillator as a whole is illustrated by the curves in Fig. 7. The vertical line $f_o$ represents the natural series resonant point of the crystal or of an overtone thereof. This is the same point as designated *a* in Fig. 6. It is to be noted that the curves to the right of this vertical line illustrate the operation without the use of the series inductor, and the curves to the left illustrate the operation with the series inductor. As previously stated, the series inductor shifts the series resonant point to a lower frequency $f_b$ (point *b*, Fig. 6) so that, although the oscillator always operates above the effective series resonant frequency, the operation with the series inductor is below the natural series resonant frequency $f_o$. By changing the value of the inductor 51, the effective series resonant frequency can be adjusted to various points between the points $f_o$ and $f_b$ illustrated in Fig. 7. The inductor may be so selected that the oscillator operates at the natural series resonant frequency if desired.

The oscillator of Fig. 5 operates at a substantially lower frequency than the oscillator described in Fig. 1 and accordingly, the frequency shift or warp obtained tends to be less. The crystal 50 has a fundamental series resonant frequency of the order of 4 megacycles and the oscillator operates at a third overtone of about 12 megacycles. The following values were used in this circuit to obtain the curves illustrated in Fig. 7.

| | |
|---|---|
| Inductance 51 | 10.5 microhenries. |
| Resistor 52 | 4700 ohms. |
| Inductor 53 | Tuning to 12.4 megacycles. |
| B plus potential | 200 volts. |
| Resistor 54 | 100,000 ohms. |
| Condenser 55 | 24 micromicrofarads. |
| Resistor 56 | 100,000 ohms. |
| Resistor 57 | 820 ohms. |
| Condenser 58 | 24 micromicrofarads. |
| Resistor 59 | 180 ohms. |

It is therefore seen that the value of the cathode resistor of the cathode follower stage is somewhat more than four times the value of the cathode resistor in the oscillator section. The energy is derived from the oscillator from the plate of the cathode follower section which is connected to plus B through resistor 60 and is bypassed by condenser 61. The output circuit includes coupling condenser 62, tuning coil 63, and coupling condenser 64. The tuning coil 63 may be tuned to a harmonic of the oscillator frequency to provide further multiplication.

As previously stated, the curves of Fig. 7 illustrate the operation of the oscillator both with and without the inductor 51. Since the inductor 51 lowers the frequency range through which operation is provided, the curves showing the operation in the two cases do not overlap and are spaced in frequency. Considering first the operation without the inductor, or when the value of the inductor is equal to zero, the voltage on the grid of the oscillator section is illustrated by the curve *e*. The current through the crystal is shown by curve *f* and the impedance of the crystal by curve *g*. The current in the grid of the cathode follower section, which is a measure of the activity of the oscillator is illustrated by the curve *h*. This curve in effect shows the voltage on the grid of the cathode follower since the resistor 56 is constant. This controls the feedback and the amplitude of oscillations. It is noted that this activity curve shows a maximum activity of a frequency approximately 220 cycles above the series resonant frequency and has a value of more than 8.5 volts for frequencies varying from the maximum activity point by 160 cycles in a negative direction and by approximately 170 cycles in a positive direction.

Considering now the operation with the inductor, it is noted that the effective series resonant point is shifted by the 10.5 microhenries series inductor to a frequency which is below the natural series resonant point by about 1040 cycles. Referring to the curves, illustrating operation of this circuit, curve *j* shows the voltage at the grid of the first stage. Curve *k* shows the crystal current, and curve *l* the impedance. The activity, represented by the grid current in the cathode follower stage is shown by curve *m*. It is noted in this case that the maximum activity occurs at a frequency approximately 750 cycles below the natural series resonance point and about 290 cycles above the effective series resonance point resulting from the use of the series inductor. The maximum activity of the oscillator is substantially the same in both cases but the frequency range over which a minimum activity of 8.5 volts is provided across the grid resistor 56 is greatly increased. In the circuit including the series inductor, adequate activity is obtained for frequencies about 250 cycles below the maximum activity point and approximately 350 cycles above the maximum activity point.

As previously stated, the oscillator of Fig. 5 operates at a lower frequency than the oscillators previously described, and at low frequencies it is extremely hard to provide a wide warp range for the oscillator. By using the circuit of Fig. 5, however, a frequency range of 600 cycles is obtained which is sufficient to permit satisfactory operation of the oscillator at the required frequency in many applications. It is to be pointed out that in all cases the operation within the limits defined has been highly stable and the tuning over the frequency range is accomplished very smoothly and easily. This circuit has been found to be very stable with changes in power supply voltage. In the circuit as illustrated, change of B plus voltage of 50 volts produced a change in frequency of less than 15 cycles. Such a change in frequency is well within the pass band of receivers and within tolerances permitted in transmitters and is therefore not objectionable. By optimizing the value of the inductance, it has been found that almost negligible frequency variations of power supply voltage may be obtained.

In Fig. 8 there is illustrated a further embodiment of the invention which utilizes an inductor in series with the crystal as in Fig. 5. The oscillator of Fig. 8 is a relatively high frequency oscillator with the crystal having a natural series resonant frequency of the order of 10 megacycles and the oscillator operating at the third overtone providing an output of 30.4 megacycles. The oscillator includes the triodes 70 and 71 with the crystal 72 connected in series with the inductor 73 and bridged by resistor 74. The cathode is grounded through resistor 75 and the plate is tuned by inductor 76, bridged by condenser 77. B plus is provided through resistor 78 and bypassed by condenser 79. Feedback is provided for the oscillator through the cathode follower section 71, with the feedback path including condenser 80 coupled from the plate of the first section to the grid of the second section. The grid is connected to ground through resistor 81 to provide an input voltage for the cathode follower. The cathode of the cathode follower section is connected to ground through resistor 82 and is coupled to the cathode of the first section through condenser 83 to provide feedback therefor.

The plate of the cathode follower section is connected to B plus through the tuned circuit 84 and dropping resistor 85 with the power supply being bypassed by condenser 86. The tuned circuit 84 selects the fifth harmonic so that the output of the entire system is increased still further to frequencies of the order of 150 megacycles. This output is applied through coupling condenser 87 to the tuned circuit including inductor 88 and condensers 89 and 90. The tapped output circuit is provided so that a low impedance output is obtained which may be applied to the cathode of the mixer stage of a superheterodyne receiver.

Fig. 9 illustrates the the activity curve of the oscillator of Fig. 8 in which the following values have been used:

| | |
|---|---|
| Inductor **73** | 1.75 microhenries. |
| Resistor **74** | 4700 ohms. |
| Resistor **75** | 47 ohms. |
| Inductor **76**, condenser **77** | Tuned to 34.3 megacycles. |
| Resistor **78** | 82,000 ohms. |
| B plus potential | 200 volts. |
| Condenser **80** | 24 micromicrofarads. |
| Resistor **81** | 220,000 ohms. |
| Resistor **82** | 820 ohms. |
| Condenser **83** | 39 micromicrofarads. |

In this oscillator the maximum activity was of the order of 26.6 volts and usable activity is obtained for frequencies lower than the frequency of maximum activity by slightly more than 2,000 cycles. On the maximum side, variations of about 1360 cycles still provide useful activity. The oscillator therefore provides an overall warp range of approximately 3400 cycles. This is illustrated in Fig. 9 wherein the crystal activity as measured by the voltage across resistor 81 is plotted against frequency.

In the circuit of Fig. 8, it will be noted that the condenser interconnecting the cathodes is relatively large, being somewhat larger than the feedback condenser connecting the plate of the first section to the grid of the cathode follower. In such case, it is necessary that the resistor in the cathode of the oscillator section be kept very low to prevent excessive power dissipation in the crystal. That is, as the value of the condenser is made larger, the impedance of the feedback path is therefore made smaller, and the crystal drive may be excessive. Excessive crystal drive will cause improper operation of the crystal and loss of stability. In the circuit of Fig. 8 it may be noted that the resistor in the cathode of the oscillator section is of very low value, being only 47 ohms.

It would be apparent from the above that there has been disclosed a basic oscillator circuit which permits wide warp or variation of the range of the frequency of the oscillator with respect to the natural series resonant frequency of the crystal. A plurality of embodiments have been described illustrating the operation of this circuit. A fundamental feature of this invention is the use of a cathode follower in the feedback path, with the entire feedback path including the cathode follower having such constants that feedback voltage is provided in the proper phase for sustaining oscillations, even when the tuning is varied through a wide range. The provision of a condenser coupling the cathodes of the two valves permits separate resistors in the two cathode circuits so that the operation of each stage can be optimized.

The resistor in the cathode follower stage of the oscillator should always be at least twice as large as the resistor in the cathode of the first stage, and in some circuits it may be many times as large such as twenty times or so (Fig. 8 approximately 17 times). Better control is obtained when providing the capacity coupling between the two cathodes than when a common cathode resistor is provided, that is, the tuning of the oscillator over the frequency or warp range is much smoother.

As previously stated, the ratio of the two cathode resistors will decrease when the condenser coupling the input of the cathode follower is larger than the condenser coupling the output thereof. When the output capacitor becomes larger and of the order of the input capacitor, the ratio of resistors becomes larger, and, when the output capacitor is larger than the input capacitor the ratio of resistors must be quite large. It is to be noted that the ratio of the input capacitor to the output capacitor varies from 0.6 to 6.0 in the circuits illustrated. The ratio of values of the cathode resistor of the cathode follower to that of the first stage varies from 4.5 to 17. The product of these ratios in all the circuits disclosed is at least 4.5 It is believed that this product must always be greater than 4 for satisfactory operation.

In the circuits illustrated the output from the crystal is taken from the anode of the cathode follower tube. It is to be pointed out that the output can be taken from other points such as the anode of the first stage or the grid or cathode of the cathode follower stage. It may be desirable in some applications to take the output voltage from the cathode of the cathode follower stage as this has a low impedance and the voltage is relatively constant. For example, this may be particularly desirable in circuits wherein a plurality of crystals are switched in the circuits to provide operation at different frequencies. In the event that the output is taken from the grid of the cathode follower stage, the condenser coupling the cathodes may be somewhat larger.

As previously stated, the value of the resistor in the grid of the cathode follower stage has a substantial effect on the amplitude of the feedback voltage, and by making this resistor larger, the feedback is increased and the oscillator activity is increased. However, the output voltage is more constant over the warp range when using a low value, and it is therefore desirable to use the lowest value which will provide the required activity.

The use of an inductor in series with the crystal increases the warp range over which adequate activity is obtained with good stability. This also allows adjustment of the frequency of maximum activity over a relatively wide range. This latter feature permits operation of the oscillator at the natural series resonant point while still providing adequate warp, as the crystal is actually operating in the inductive reactance range of an effective series resonant point below the natural series resonant frequency.

Although a plurality of embodiments of the invention have been disclosed which illustrates the same, it is obvious that various changes and modifications can be made therein without departing from the intended scope of the invention as defined in the appended claims.

I claim:

1. A crystal controlled oscillator providing stable operation over a band of frequencies including in combination, a first electron discharge valve having a cathode, an anode, and a control grid, a crystal connected between said control grid and a reference potential, a first resistor bridging said crystal, a second resistor connecting said cathode to said reference potential, a tunable circuit connecting said anode of said valve to a source of positive potential, a second electron discharge valve having a cathode, an anode and a control grid, a first condenser connected between said anode of said first valve and said grid of said second valve, a third resistor connected between said grid of said second valve and said reference potential, a fourth resistor connected between said cathode of said second valve and said reference potential, and a second condenser connected between said cathode of second valve and said cathode of said first valve, whereby feedback is provided through said second electron discharge valve acting as a cathode follower stage with said first condenser coupled to the input thereof and said second condenser coupled to the output thereof, said fourth resistor having a value of resistance at least twice that of said second resistor, and said second condenser having a value of capacitance not substantially greater than that of said first condenser.

2. A crystal controlled oscillator providing stable operation over a band of frequencies including in combination, a first electron discharge valve having a cathode, an anode, and a control grid, a crystal connected between said control grid and a reference potential, a first resistor bridging said crystal for causing said crystal to operate in or near the series mode, said first resistor having a value of resistance of not more than 5,000 ohms, a second resistor connecting said cathode to said reference potential, a tunable circuit connecting said anode of said valve to a source of positive potential, a second electron discharge valve having a cathode, an anode and a control grid, a first condenser connected between said anode of said first electron discharge valve and said grid of said second discharge valve, a third resistor connected between said grid of said second electron discharge valve and said reference potential and providing an input voltage for said second valve, a fourth resistor connected between said cathode of said second valve and said reference potential, and a second condenser connected between said cathode of second valve and said cathode of said first valve, whereby feedback is provided through said second electron discharge valve acting as a cathode follower stage with said first condenser coupled to the input thereof and said second condenser coupled to the output thereof, said fourth resistor having a value of resistance at least twice that of said second resistor.

3. A crystal controlled oscillator providing stable operation over a band of frequencies including in combination, a first electron discharge valve having a cathode, an anode, and a control grid, a crystal and an inductor connected in series between said control grid and a reference potential, a first resistor bridging said crystal and said inductor, a second resistor connecting said cathode to said reference potential, a tunable circuit connecting said anode of said valve to a source of positive potential, a second electron discharge valve having a cathode, an anode and a control grid, a first condenser connected between said anode of said first valve and said grid of said second valve, a third resistor connected between said grid of said second valve and said reference potential, a fourth resistor connected between cathode of said second valve and said reference potential, and a second condenser connected between said cathode of second valve and said cathode of said first valve, whereby feedback is provided through said second electron discharge valve acting as a cathode follower stage with said first condenser coupled to the input thereof and said second condenser coupled to the ouput thereof, said fourth resistor having a value of resistance at least twice that of said second resistor, and said second condenser having a value of capacitance not greater than that of said first condenser.

4. A crystal controlled oscillator providing stable operation over a band of frequencies including in combination, a first electron discharge valve having a cathode, an anode, and a control grid, a crystal connected between said control grid and a reference potential, a first resistor bridging said crystal, a second resistor connecting said cathode to said reference potential, a tunable circuit connecting said anode of said valve to a source of positive potential, a second electron discharge valve having a cathode, an anode and a control grid, a first condenser connected between said anode of said first valve and said grid of said second valve, a third resistor connected between said grid of said second valve and said reference potential, a fourth resistor connected between said cathode of said second valve and said reference potential, and a second condenser connected between said cathode of second valve and said cathode of said first valve, whereby feedback is provided through said second electron discharge valve acting as a cathode follower stage with said first condenser coupled to the input thereof and said second condenser coupled to the output thereof, said fourth resistor having a value of resistance at least twice that of said second resistor, and said second condenser having a value of capacitance substantially equal to that of said first condenser.

5. A crystal controlled oscillator providing stable operation over a band of frequencies including in combination, a first electron discharge valve having a cathode, an anode, and a control grid, a crystal connected between said control grid and ground, a first resistor bridging said crystal, a second resistor connecting said cathode to ground, a tunable circuit connecting said anode of said valve to a source of positive potential, a feedback circuit including a second electron discharge valve having a cathode, an anode and a control grid and operating as a cathode follower, a first condenser connected between said anode of said first valve and said grid of said second valve, a third resistor connected between said grid of said second valve and ground, a fourth resistor connected between said cathode of said second valve and ground, and a second condenser connected between said cathodes of said first and second valves, said first and second condensers and said second, third and fourth resistors having such values of resistance that said feedback circuit sustains oscillations in said first valve over a range of frequencies determined by said tunable circuit, said fourth resistor having a value of resistance at least four times that of said second resistor, and the ratio of the capacitance value of said first condenser to that of said second condenser times the ratio, of the resistance value of said fourth resistor to that of said second resistor being at least four to one.

6. A crystal controlled oscillator providing stable operation over a band of frequencies including in combination, a first electron discharge valve having a cathode, an anode, and a control grid, a crystal connected between said control grid and ground, a first resistor bridging said crystal, said first resistor having a value of resistance of not more than 5,000 ohms, a second resistor connecting said cathode to ground, a tunable circuit connecting said anode of said valve to a source of positive potential, a feedback circuit including a second electron discharge valve having a cathode, an anode and a control grid and operating as a cathode follower, a first condenser connected between said anode of said first valve and said grid of said second valve, a third resistor connected between said grid of said second valve and ground, a fourth resistor connected between said cathode of said second valve and ground, and a second condenser connected between said cathodes of said first and second valves, said fourth resistor having a value of resistance at least four times that of said second resistor, said first and second condensers and said second, third and fourth resistors having such values with respect to each other that said feedback circuit sustains oscillations in said first valve over a range of frequencies determined by said tunable circuit.

7. A crystal controlled oscillator providing stable operation over a band of frequencies including in combination, a first electron discharge valve having a cathode, an anode, and a control grid, a crystal connected between said control grid and ground, a first resistor bridging said crystal, a second resistor connecting said cathode to ground, a tunable circuit connecting said cathode of said valve to a source of positive potential, a feedback circuit including a second electron discharge valve having a cathode, an anode and a control grid and operating as a cathode follower, a first condenser connected between said anode of said first valve and said grid of said second valve, a third resistor connected between said grid of said second valve and ground, a fourth resistor connected between said cathode of said second valve and ground, and a second condenser connected between said cathodes of said first and second valves, said first and second condensers and said second, third and fourth resistors having such values that said feedback circuit sustains oscillations in said first valve over a range of frequencies determined by said tunable circuit, said first condenser having a value of capacitance greater than that of said second condenser, said fourth resistor having a value of resistance at least two times that of said second resistor, and the ratio of the resistance value of said fourth resistor to that of said second resistor times the ratio of the capacitance value of said first condenser to that of said second condenser being at least four to one.

8. A crystal controlled oscillator providing stability over a range of frequencies including in combination, a first electron discharge valve having a cathode, an anode, and a control grid, a crystal circuit connected to said control grid including a crystal and an inductor connected in series and a first resistor bridging said crystal and said inductor, a second resistor connected to said cathode of said valve, an adjustable tuning circuit connected to said plate of said valve, and a feedback circuit for said valve including a second electron discharge valve having a cathode, an anode and a control grid, a first condenser connected between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance such that oscillations will not take place in said first valve in the absence of said feedback circuit, said feedback circuit including said first and second condensers and said second electron discharge valve providing feedback of proper phase to sustain oscillations in said first valve over a range of frequencies in accordance with the adjustment of said tuning circuit, said first and second condensers having substantially the same values of capacitance, and said fourth resistor having a value of resistance at least four times that of said second resistor.

9. A crystal controlled oscillator providing stability over a range of frequencies including in combination, a first electron discharge valve having a cathode, an anode, and a control grid, a crystal circuit connected to said control grid including a crystal and an inductor connected in series and a first resistor bridging said crystal and said inductor, a second resistor connected to said cathode of said valve, an adjustable tuning circuit connected to said plate of said valve, and a feedback circuit for said valve including a second electron discharge valve having a cathode, an anode and a control grid, a first condenser connected between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance such that oscillations will not take place in said first valve in the absence of said feedback circuit, said feedback circuit including said first and second condensers and said second electron discharge valve providing feedback of proper phase to sustain oscillations in said first valve over a range of frequencies in accordance with the adjustment of said tuning circuit, said fourth resistor having a value of resistance at least four times that of said second resistor, and the product of the ratio of the capacitance value of said first condenser to that of said second condenser and the ratio of the resistance value of said fourth resistor to that of said second resistor being at least four to one.

10. A crystal controlled oscillator providing stability over a range of frequencies including in combination, a first electron discharge valve having a cathode, an anode, and a control grid, a crystal circuit connected to said control grid including a crystal and a first resistor bridging said crystal, a second resistor connected to said cathode of said valve, an adjustable tuning circuit connected to said plate of said valve, and a feedback circuit for said valve including a second electron discharge valve having a cathode, an anode and a control grid, a first condenser connected between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance such that oscillations will not take place in said first valve in the absence of said feedback circuit, said feedback circuit including said first and second condensers and said second electron discharge valve providing feedback of proper phase to sustain oscillations in said first valve over a range of frequencies in accordance with the adjustment of said tuning circuit, said first and second condensers having substantially the same values of capacitance, and said fourth resistor having a value of resistance at least four times that of said second resistor.

11. A crystal controlled oscillator providing stability over a range of frequencies including in combination, a first electron discharge valve having a cathode, an anode, and a control grid, a crystal circuit connected to said control grid, a crystal circuit connected to said control grid including a crystal and an inductor connected in series and a first resistor bridging said crystal and said inductor, a second resistor connected to said cathode of said valve, an adjustable tuning circuit connected to said plate of said valve, and a feedback circuit for said valve including a second electron discharge valve having a cathode, an anode, and a control grid, a first condenser connected between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance such that said crystal operates near the series mode, said fourth resistor having a value of resistance at least four times that of said second resistor, said tuning circuit being adjustable to tune said oscillator to a range of frequencies above a series resonant frequency of said crystal, said feedback circuit including said first and second condensers and said second electron discharge valve providing feedback of proper phase to sustain oscillations in said first valve over said range of frequencies.

12. A crystal controlled oscillator providing stability over a range of frequencies including in combination, a first electron discharge valve having a cathode, an anode, and a control grid, a crystal connected to said control grid and a first resistor bridging said crystal, a second resistor connected to said cathode of said valve, an adjustable tuning circuit connected to said plate of said valve, and a feedback circuit for said valve including a second electron discharge valve having a cathode, an anode and a control grid, a first condenser connected between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance of not more than 5,000 ohms and causing operation of said crystal near the series mode thereof, said tuning circuit being adjustable to tune said oscillator to a range of frequencies above a series resonant frequency of said crystal, said feedback circuit including said first and second condensers and said second electron discharge valve providing feedback of proper phase to sustain oscillations in said first valve over said range of frequencies, said first and second condensers having substantially the same values of capacitance, and said fourth resistor having a value of resistance at least four times that of said second resistor.

13. A crystal controlled oscillator providing stability over a range of frequencies including in combination, a first electron discharge valve having a cathode, an anode, and a control grid, a crystal circuit connected to said control grid including a crystal and an inductor connected in series and a first resistor bridging said crystal and said inductor, a second resistor connected to said cathode of said valve, an adjustable tuning circuit connected to said plate of said valve, and a feedback circuit for said valve including a second electron discharge valve having a cathode, an anode and a control grid, a first condenser between said plate of said first valve and said grid of said second valve, a third resistor connected to said grid of said second valve, a fourth resistor connected to said cathode of said second valve, and a second condenser connected between said cathode of said second valve and said cathode of said first valve, said first resistor having a value of resistance of not more than 5,000 ohms and causing operation of said crystal near the series mode thereof, said tuning circuit being adjustable to tune said oscillator to a range of frequencies above a series resonant frequency of said crystal, said feedback circuit including said first and second condensers and said second electron discharge valve providing feedback of proper phase to sustain oscillations in said first valve over said range of frequencies, said fourth resistor having a value of resistance at least twice that of said second resistor, and said first and second condensers having substantially the same values of capacitance.

References Cited in the file of this patent

UNITED STATES PATENTS

| | | |
|---|---|---|
| 2,269,417 | Crosby | Jan. 6, 1942 |
| 2,568,852 | Goddard | Sept. 25, 1951 |